US010361230B2

(12) United States Patent
Kuboi

(10) Patent No.: US 10,361,230 B2
(45) Date of Patent: *Jul. 23, 2019

(54) IMAGING ELEMENT, METHOD FOR MANUFACTURING IMAGING ELEMENT, PIXEL DESIGN METHOD, AND ELECTRONIC APPARATUS WITH LIGHT COLLECTING PARTS HAVING PLURAL PROJECTION AND DEPRESSION STRUCTURES

(71) Applicant: SONY SEMICONDUCTOR SOLUTIONS CORPORATION, Kanagawa (JP)

(72) Inventor: Nobuyuki Kuboi, Tokyo (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 47 days.

This patent is subject to a terminal disclaimer.

(21) Appl. No.: 15/595,236

(22) Filed: May 15, 2017

(65) Prior Publication Data
US 2017/0250213 A1  Aug. 31, 2017

Related U.S. Application Data

(63) Continuation of application No. 14/293,591, filed on Jun. 2, 2014, now Pat. No. 9,666,623, which is a (Continued)

(30) Foreign Application Priority Data

Feb. 22, 2011 (JP) .................................. 2011-035471

(51) Int. Cl.
H01L 27/146 (2006.01)
H01L 27/148 (2006.01)

(52) U.S. Cl.
CPC .... *H01L 27/14605* (2013.01); *H01L 27/1462* (2013.01); *H01L 27/1464* (2013.01);
(Continued)

(58) Field of Classification Search
CPC ......... H01L 27/14605; H01L 27/14627; H01L 27/14812
(Continued)

(56) References Cited

U.S. PATENT DOCUMENTS 5,952,645 A * 9/1999 Wang ................ H01L 27/14627
250/208.1
8,411,192 B2   4/2013 Fukamachi et al.
(Continued)

FOREIGN PATENT DOCUMENTS

JP          11-98392 A    4/1999
JP       2002-170944 A    6/2002
(Continued)

OTHER PUBLICATIONS

Office Action for CN Patent Application No. 2012-10035073.5, dated Aug. 11, 2015.
(Continued)

*Primary Examiner* — Que Tan Le
(74) *Attorney, Agent, or Firm* — Chip Law Group

(57) ABSTRACT

An imaging element includes a plurality of pixels that are two-dimensionally arranged and each have a light receiving part including a photoelectric conversion element and a light collecting part that collects incident light toward the light receiving part. Each of the light collecting parts in the plurality of pixels includes an optical functional layer having, in a surface, a specific projection and depression structure depending on the pixel position.

24 Claims, 18 Drawing Sheets

Related U.S. Application Data continuation of application No. 13/372,620, filed on Feb. 14, 2012, now Pat. No. 8,759,738.

(52) U.S. Cl.
CPC .. *H01L 27/14627* (2013.01); *H01L 27/14685* (2013.01); *H01L 27/14812* (2013.01)

(58) Field of Classification Search
USPC .............................................. 250/208.1, 239
See application file for complete search history.

(56) References Cited

U.S. PATENT DOCUMENTS

| | | | |
|---|---|---|---|
| 8,878,122 B2 | 11/2014 | Yokogawa | |
| 2011/0147872 A1 | 6/2011 | Inoue et al. | |

FOREIGN PATENT DOCUMENTS

| | | |
|---|---|---|
| JP | 2006-100764 A | 4/2006 |
| JP | 2006-304364 A | 11/2006 |
| JP | 2009-015315 A | 1/2009 |
| JP | 2009-116056 A | 5/2009 |
| JP | 2009-266900 A | 11/2009 |
| JP | 2009-267000 A | 11/2009 |
| JP | 2010-067971 A | 3/2010 |
| WO | 2010/116584 A1 | 10/2010 |
| WO | 2011/016270 A1 | 2/2011 |

OTHER PUBLICATIONS

Office Action for JP Patent Application No. 2011-035471, dated Nov. 5, 2014.
Notice of Allowance and Fees Due (PTOL-85) for U.S. Appl. No. 14/293,591, dated Jan. 30, 2017, 07 pages.
Final Rejection for U.S. Appl. No. 14/293,591, dated Sep. 22, 2016, 07 pages.
Non-Final Rejection for U.S. Appl. No. 14/293,591, dated May 9, 2016, 10 pages.
Final Rejection for U.S. Appl. No. 14/293,591, dated Jan. 11, 2016, 09 pages.
Non-Final Rejection for U.S. Appl. No. 14/293,591, dated Aug. 24, 2015, 05 pages.

\* cited by examiner

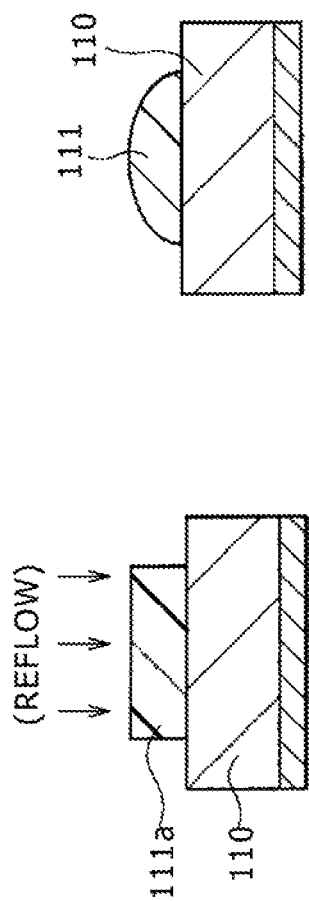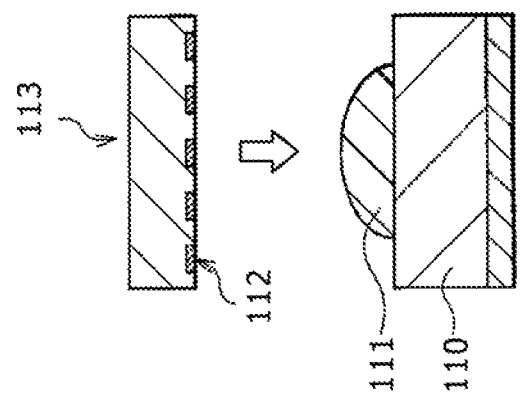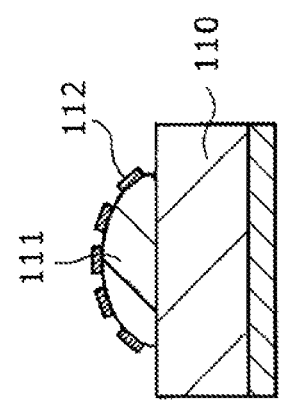

IMAGING ELEMENT, METHOD FOR MANUFACTURING IMAGING ELEMENT, PIXEL DESIGN METHOD, AND ELECTRONIC APPARATUS WITH LIGHT COLLECTING PARTS HAVING PLURAL PROJECTION AND DEPRESSION STRUCTURES

CROSS REFERENCE TO RELATED APPLICATIONS

The present disclosure is a continuation of U.S. patent application Ser. No. 14/293,591 filed Jun. 2, 2014, which is a continuation of U.S. patent application Ser. No. 13/372,620 filed Feb. 14, 2012, which claims priority from Japanese Priority Patent Application JP 2011-035471 filed in the Japan Patent Office on Feb. 22, 2011. Each of the above referenced applications is hereby incorporated by reference in its entirety.

BACKGROUND

The present disclosure relates to an imaging element such as a charge coupled device (CCD) image sensor or a complementary metal oxide semiconductor (CMOS) image sensor and an electronic apparatus using such an imaging element.

In recent years, application of the semiconductor imaging device to the electronic apparatus used in the field of medicine (endoscope camera, vision chip, biosensor, etc.) is being actively promoted. So, achievement of both further enhancement in the sensitivity and size reduction of the device (microminiaturization of the pixels) is required. However, the progression of microminiaturization of the pixels shortens the exit pupil distance and thus causes the following problem. Specifically, the incident angle of light to the on-chip lens (OCL) in the pixel end area becomes large, which causes increase in the reflectance at the OCL surface and increase in vignetting.

Therefore, generally in the image sensor such as CCD image sensor and CMOS image sensor, the problem is addressed by providing an antireflection film on the surface of the OCL or carrying out correction by shifting the center axis of the lens from the center axis of the photodiode (so-called pupil correction).

Furthermore, recently there has been proposed a technique to enhance the light collection efficiency by employing a structure in which the OCL is formed into a cylindrical shape and plural slits are provided in this cylindrical lens (digital microlens) to thereby change the effective refractive index of the lens depending on the incident angle (refer to Japanese Patent Laid-Open No. 2009-266900 (hereinafter, Patent Document 1)).

SUMMARY

However, if an antireflection film is stacked on the OCL surface, the microminiaturization of the pixels is inhibited by it. Furthermore, for pupil correction, a method of shifting the center axis of the lens as described above or shrinking the lens itself (decreasing the lens diameter) to shift the center axis to the inner side is known. However, in the former, the microminiaturization of the pixels is inhibited. In the latter, the light collection area becomes small and the sensitivity is lowered.

In the method described in the above-described Patent Document 1, because of the special lens structure in which the plural slits are provided with a complicated pattern, the mask shape is also complicated and micro-processing for a high aspect ratio (e.g. 10 or higher) needs to be performed with high processing reproducibility. Such processing becomes more difficult as the microminiaturization of the pixels progresses to a larger extent. Furthermore, the manufacturing cost is also not suppressed because of the complicated and difficult processing.

The field of application of the semiconductor imaging device is being widened, including the recent development of advanced medical techniques. Thus, further sensitivity enhancement and microminiaturization are required. Furthermore, it is desired to realize an imaging device capable of addressing such sensitivity enhancement and microminiaturization by a simple, low-cost processing process.

There is a need for a technique to provide an imaging element, a method for manufacturing an imaging element, a pixel design method, and an electronic apparatus that are capable of realizing sensitivity enhancement and microminiaturization by a simple processing process.

According to an embodiment of the present disclosure, there is provided an imaging element including a plurality of pixels configured to be two-dimensionally arranged and each have a light receiving part including a photoelectric conversion element and a light collecting part that collects incident light toward the light receiving part. Each of the light collecting parts in the plurality of pixels includes an optical functional layer having, in a surface, a specific projection and depression structure depending on the pixel position.

In the imaging element according to the embodiment of the present disclosure, each of the two-dimensionally arranged plural pixels has the light receiving part including the photoelectric conversion element and the light collecting part that collects incident light onto the light receiving part. In the surface of the optical functional layer in each light collecting part, the specific projection and depression structure depending on the pixel position is provided. Due to this feature, the reflectance at the optical functional layer surface is reduced and pupil correction is achieved.

According to an embodiment of the present disclosure, there is provided a method for manufacturing an imaging element. The method includes forming an optical functional layer having, in a surface, a specific projection and depression structure depending on the pixel position in each of light collecting parts in a plurality of pixels, in forming the plurality of pixels that are two-dimensionally arranged and each have a light receiving part including a photoelectric conversion element and the light collecting part that collects incident light toward the light receiving part.

In the method for manufacturing an imaging element according to the embodiment of the present disclosure, in forming the plural pixels that are two-dimensionally arranged and each have the light receiving part including the photoelectric conversion element and the light collecting part that collects incident light toward the light receiving part, the optical functional layer having, in the surface, the specific projection and depression structure depending on the pixel position are formed in each light collecting part. In this forming, a complicated mask shape is unnecessary and high processing accuracy is also not required.

According to an embodiment of the present disclosure, there is provided a pixel design method used in designing the scale of a projection and depression structure in a pixel including an optical functional layer having the projection and depression structure in a surface. The method includes obtaining the effective refractive index of the optical functional layer as a function of exit pupil distance and the distance from a center pixel, and deciding the scale of the projection and depression structure based on the obtained effective refractive index.

According to an embodiment of the present disclosure, there is provided an electronic apparatus including the imaging element according to the above-described embodiment of the present disclosure.

In the imaging element according to the embodiment of the present disclosure, in the plural pixels that are two-dimensionally arranged and each have the light receiving part including the photoelectric conversion element and the light collecting part that collects incident light onto the light receiving part, the specific projection and depression structure depending on the pixel position is provided in the surface of the optical functional layer in each light collecting part. Due to this feature, the reflectance at the optical functional layer surface can be reduced and pupil correction can be carried out, so that sensitivity enhancement can be realized. Furthermore, by the method for manufacturing an imaging element according to the embodiment of the present disclosure, such an imaging element can be manufactured without using a complicated mask shape and without requiring high processing accuracy. Therefore, it is possible to address also microminiaturization. Thus, sensitivity enhancement and microminiaturization can be realized by a simple processing process.

BRIEF DESCRIPTION OF THE DRAWINGS

FIGS. 10A to 10E are schematic sectional views for explaining a processing process (nanoimprint method) for a projection and depression structure in a lens surface;

DETAILED DESCRIPTION OF THE PREFERRED EMBODIMENT

An embodiment of the present disclosure will be described in detail below with reference to the drawings. The order of the description is as follows.
1. Embodiment (example in which predetermined projection and depression structure is provided in surface of on-chip lens across area from center pixel to end pixel)
2. Modification Example 1 (example in which lens position is shifted depending on pixel position)
3. Modification Example 2 (example in which predetermined projection and depression structure is provided for inner lens)
4. Modification Example 3 (example in which predetermined projection and depression structure is provided for antireflection film)
5. Modification Example 4 (example in which embodiment of the present disclosure is applied to front-illuminated image sensor)
6. Application Examples (examples of application to electronic apparatus)

Embodiment

Figure 1:
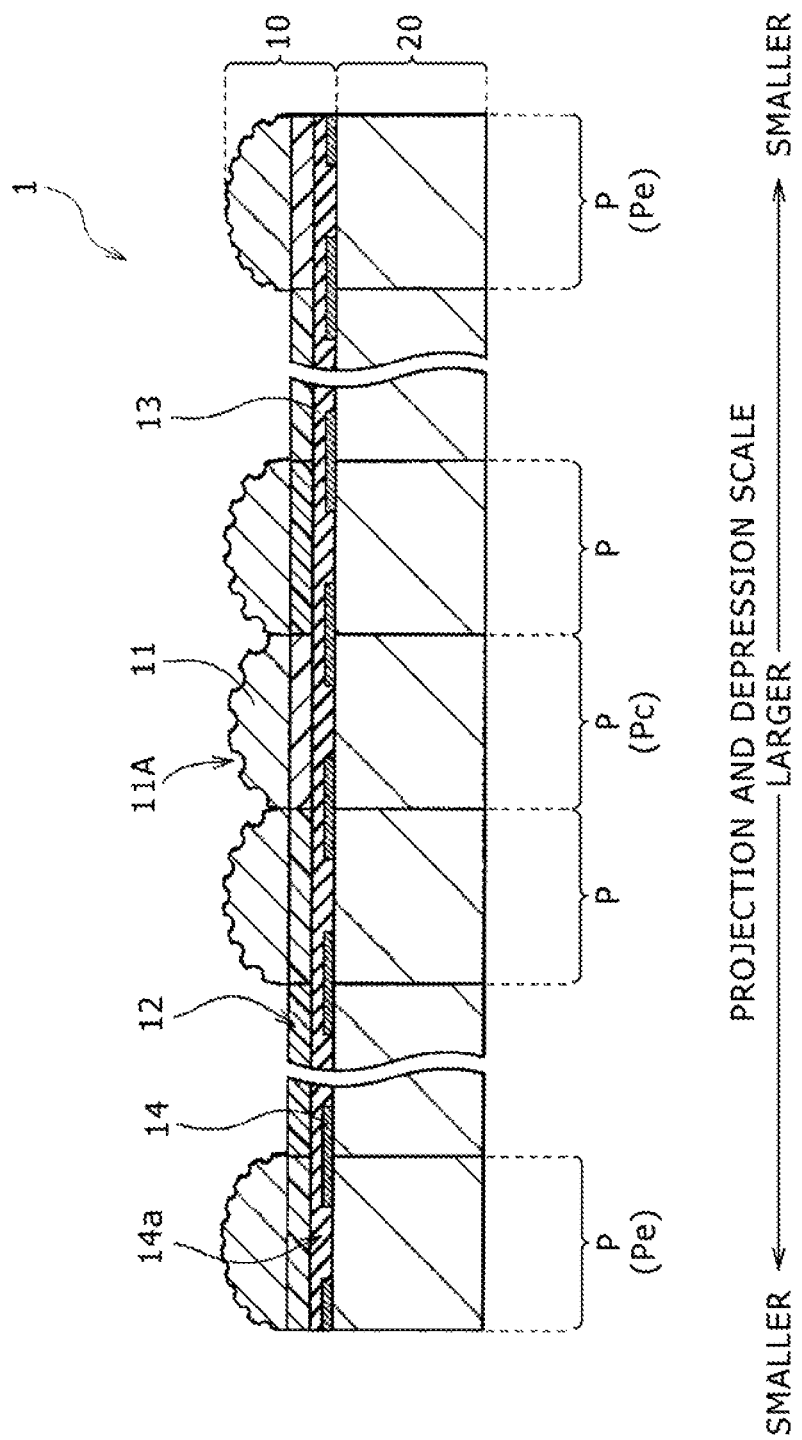
FIG. 1 is a schematic sectional view showing the schematic configuration of an image sensor according to one embodiment of the present disclosure.

FIG. 1 shows the sectional configuration of an image sensor according to one embodiment of the present disclosure (image sensor 1). The image sensor 1 is e.g. a solid-state imaging element (CCD, CMOS) of the back-illuminated type (type of light reception at the back surface), and has a structure in which plural pixels P are two-dimensionally arranged over a substrate. Each pixel P includes a light receiving part 20 including a photoelectric conversion element (photodiode 202 to be described later) and a light collecting part 10 that collects incident light toward the light receiving part 20.

(Light Collecting Part 10)

The light collecting part 10 is provided on the light receiving surface of the light receiving part 20 and has an on-chip lens 11 for each pixel P on the light incident side. In the light collecting part 10, between the on-chip lens 11 and the light receiving part 20, a color filter 12, an antireflection film 13, and a light blocking film 14 are provided in that order from the side of the on-chip lens 11. In the present embodiment, the on-chip lens 11 is one specific example of the optical functional layer in the present disclosure.

The on-chip lens 11 has a function to collect light onto the light receiving surface of the light receiving part 20 (specifically, the photodiode 202 of the light receiving part 20). The lens diameter of this on-chip lens 11 is set to the value depending on the size of the pixel P and is e.g. about 2 μm or smaller. The refractive index of the lens material of this on-chip lens 11 is e.g. 1.1 to 1.4. Examples of the lens material include a silicon oxide film (SiO₂), and a proper material is selected depending on projection and depression design and manufacturing method to be described later.

In the present embodiment, a projection and depression structure 11A is provided in the surface of the on-chip lens 11 (the surface of the on-chip lens 11 is a projection and depression surface), and the scale of this projection and depression structure 11A (hereinafter, projection and depression scale) has distribution associated with the pixel position. Specifically, the projection and depression scale is set on the order of size smaller than the received-light wavelength in the light receiving part 20 for example, and is so designed as to become smaller as the distance from a center pixel Pc becomes longer. The detailed configuration of this projection and depression structure 11A and the design method of the projection and depression scale will be described later. The "scale" in the present specification is defined based on the width and depth (height) of the depression part (projection part) in the projection and depression structure. The following description is based on the assumption that the aspect ratios of the respective projection and depression structures 11A are equivalent to each other in the whole area of the pixels P. However, the aspect ratios of the respective depression parts (projection parts) do not necessarily need to be equivalent to each other. Advantageous effects equivalent to those of the present embodiment can be achieved as long as the projection and depression structure 11A has a shape allowing realization of the effective refractive index in the design method to be described later.

The color filter 12 is e.g. any of a red (R) filter, a green (G) filter, and a blue (B) filter and is provided for each pixel P for example. These color filters are provided with a regular color array (e.g. Bayer array). The existence of the color filter 12 allows the image sensor 1 to obtain received-light data with a color corresponding to this color array.

The antireflection film 13 is configured by e.g. a single-layer film formed of a silicon oxide film (SiO₂) or a silicon nitride film (SiN) or a multilayer film of these materials.

The light blocking film 14 has an aperture 14a on the optical path of the on-chip lens 11 and is provided in order to suppress crosstalk of a light beam between adjacent pixels. This light blocking film 14 is composed of e.g. tungsten (W) and has a thickness of e.g. 100 nm.

(Light Receiving Part 20)

Figure 2:
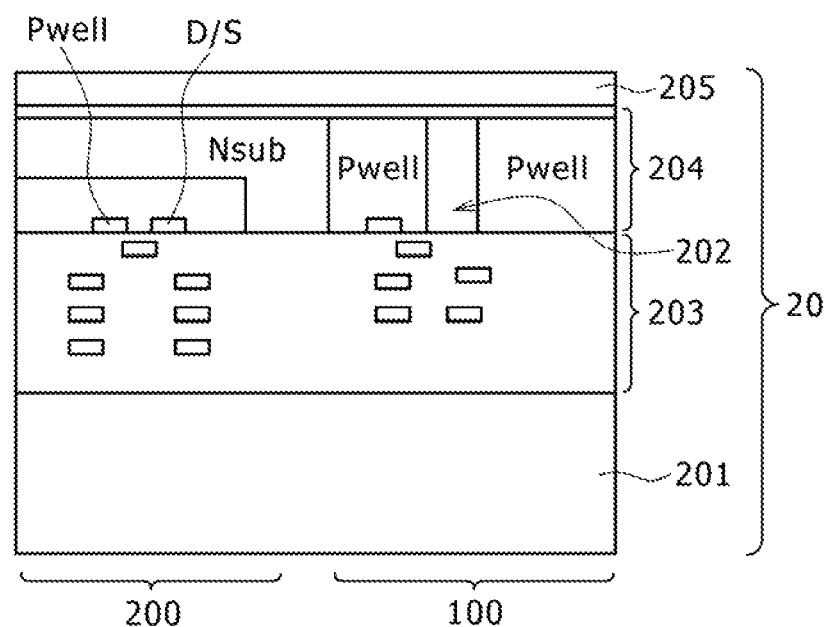
FIG. 2 is a schematic sectional view showing the detailed configuration of a light receiving part shown in FIG. 1.

FIG. 2 shows the sectional structure of the light receiving part 20 (back-illuminated structure). The light receiving part 20 has a structure in which a pixel section 100 and a peripheral circuit section 200 are integrated over the same substrate 201. In the light receiving part 20, the photodiode 202 is provided over the substrate 201 with the intermediary of a wiring layer 203 including transistor and metal wiring. The photodiode 202 is buried in a silicon (Si) layer 204 and an SiO₂ film 205 is formed on this Si layer 204.

Figure 3:
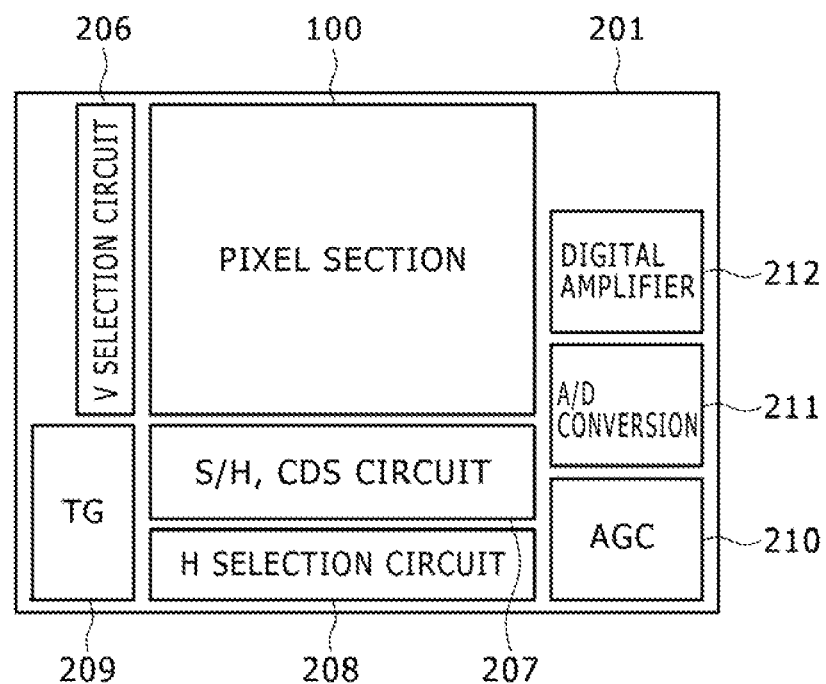
FIG. 3 is a schematic plan view showing the peripheral circuit configuration of the light receiving part shown in FIG. 1.

FIG. 3 is a functional block diagram showing the peripheral circuit configuration of the pixel section of the light receiving part 20. The light receiving part 20 includes a vertical (V) selection circuit 206, a sample/hold (S/H) and correlated double sampling (CDS) circuit 207, a horizontal (H) selection circuit 208, a timing generator (TG) 209, an automatic gain control (AGC) circuit 210, an A/D conversion circuit 211, and a digital amplifier 212. These circuits are mounted over the same substrate (chip) 201.

[Detailed Configuration Example of Projection and Depression Structure]

With reference to FIGS. 4A to 8, the detailed configuration and design method of the projection and depression structure 11A will be described below. In the present embodiment, effects of reflectance reduction and pupil correction are realized by providing the projection and depression structure 11A. The principle thereof and the design method of the projection and depression structure 11A will be described below.

(Principle of Reflectance Reduction)

Figure 4A:
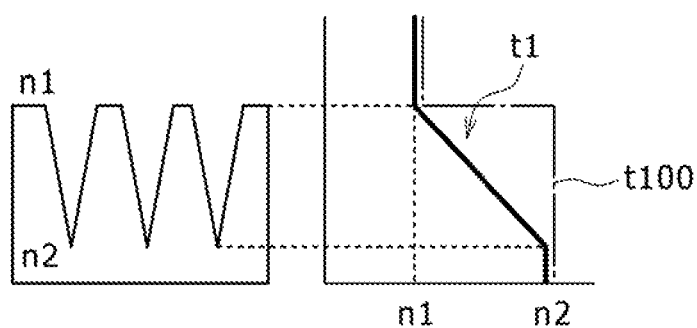
FIGS. 4A and 4B are conceptual diagrams showing refractive index change near an interface depending on projection and depression scale.
Figure 4B:
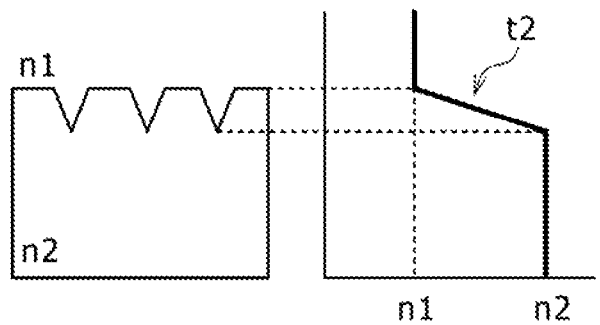
Figure 5:
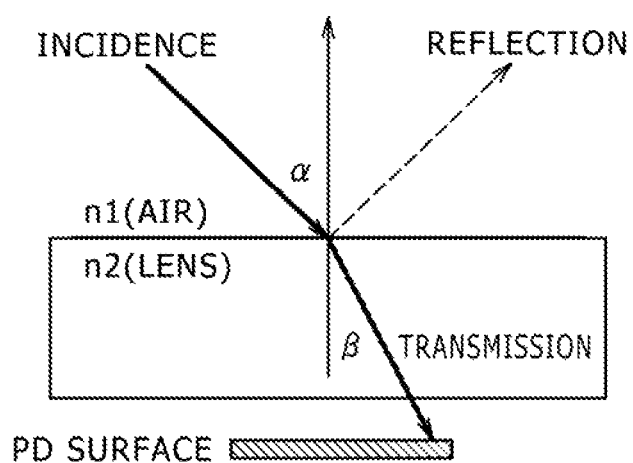
FIG. 5 is a characteristic diagram showing the relationship between the refractive index and reflectance of light incident on a flat surface.

FIGS. 4A and 4B are conceptual diagrams showing refractive index change near the interface due to the giving of the projection and depression structure 11A. As described above, the projection and depression structure 11A exists in the surface of the on-chip lens 11 in the present embodiment. Due to this projection and depression structure 11A, refractive index change near the interface between the air layer and the lens layer becomes gentler effectively. For example, as shown in FIG. 4A, at the center part (center pixel Pc), refractive index change near the interface between a layer with a refractive index n1 and a layer with a refractive index n2 is gentler (t1) compared with the case in which the projection and depression structure is not provided (the interface is a flat surface) (t100). This applies also to the end part (end pixel Pe) (t2 in FIG. 4B). In this manner, refractive index change in incidence on the surface of the on-chip lens 11 (interface with the air layer) can be made gentler by giving the projection and depression structure 11A. This can reduce the reflectance at the lens surface.

The projection and depression scale of the projection and depression structure 11A changes depending on the pixel position. It is desirable that the projection and depression scale in each pixel is set within a range smaller than about ⅕ of the received-light wavelength. For example, for the received-light wavelength of 550 nm, the projection and depression scale of the center pixel Pc is set to 100 nm and the scale is so set as to become smaller in the direction toward the end pixel Pe. However, the received-light wavelength is not limited to 550 nm and this setting way can be applied also to a wavelength of visible light other than 550 nm and other wavelengths of infrared light and so forth. Whichever received-light wavelength is assumed, it is desirable that the projection and depression scale is set within the above-described range.

(Principle of Pupil Correction)

The principle of the pupil correction in the projection and depression structure 11A will be described below. When the projection and depression structure 11A smaller than the received-light wavelength is considered, light transmission and reflection by a flat surface like that shown in FIG. 5 can be considered approximately. When light is incident from a medium with a refractive index n1 (e.g. air) onto a medium with a refractive index n2 (e.g. lens), generally reflectance R at the lens surface is represented by the following equation (1) if the incident angle is defined as α and the transmission angle (exit angle: equivalent to the incident angle to the light receiving surface of the photodiode) is defined as β. Furthermore, according to the Snell's law, the relationship among the incident angle α, the exit angle β, and the refractive indexes n1 and n2 is represented by the following equation (2).

$$R = \frac{\left\{\frac{\sin(\alpha-\beta)}{\sin(\alpha+\beta)}\right\}^2 + \left\{\frac{\tan(\alpha-\beta)}{\tan(\alpha+\beta)}\right\}^2}{2} \quad (1)$$

$$\frac{\sin \alpha}{\sin \beta} = \frac{n2}{n1} \quad (2)$$

$$h^2 = r^2 + H^2 - 2rH \cos \theta \quad (3)$$

$$L^2 = HL^2 + h^2 - 2HLh \cos \Delta \quad (4)$$

$$HL^2 = (L + r \sin \theta)^2 + (H - r \cos \theta)^2 \quad (5)$$

$$\Delta = \arccos\left\{\frac{H}{\sqrt{(H^2 + L^2)}}\right\} \quad (6)$$

The effect of the pupil correction in the image sensor 1 is obtained by keeping the exit angle β constant against various incident angles α (across the whole pixel area). To keep the exit angle β constant, the refractive index n2 of the lens surface layer is effectively changed depending on the incident angle α as described later. Specifically, by changing the scale of the projection and depression structure in the lens surface depending on the distance from the center pixel Pc as shown in FIG. 1, the effective refractive index can be so changed that the exit angle β may be kept constant. Thus, the effect of the pupil correction can be obtained. In the present specification, such an "apparent" refractive index that changes depending on the projection and depression scale is referred to as the "effective refractive index."

Based on the above-described principles, by giving the lens surface layer the projection and depression structure 11A having scale distribution depending on the distance from the center pixel Pc, the effects of both pupil correction and reflectance reduction are obtained, which leads to enhancement in the light correction efficiency in the light collecting part 10.

Figure 6:
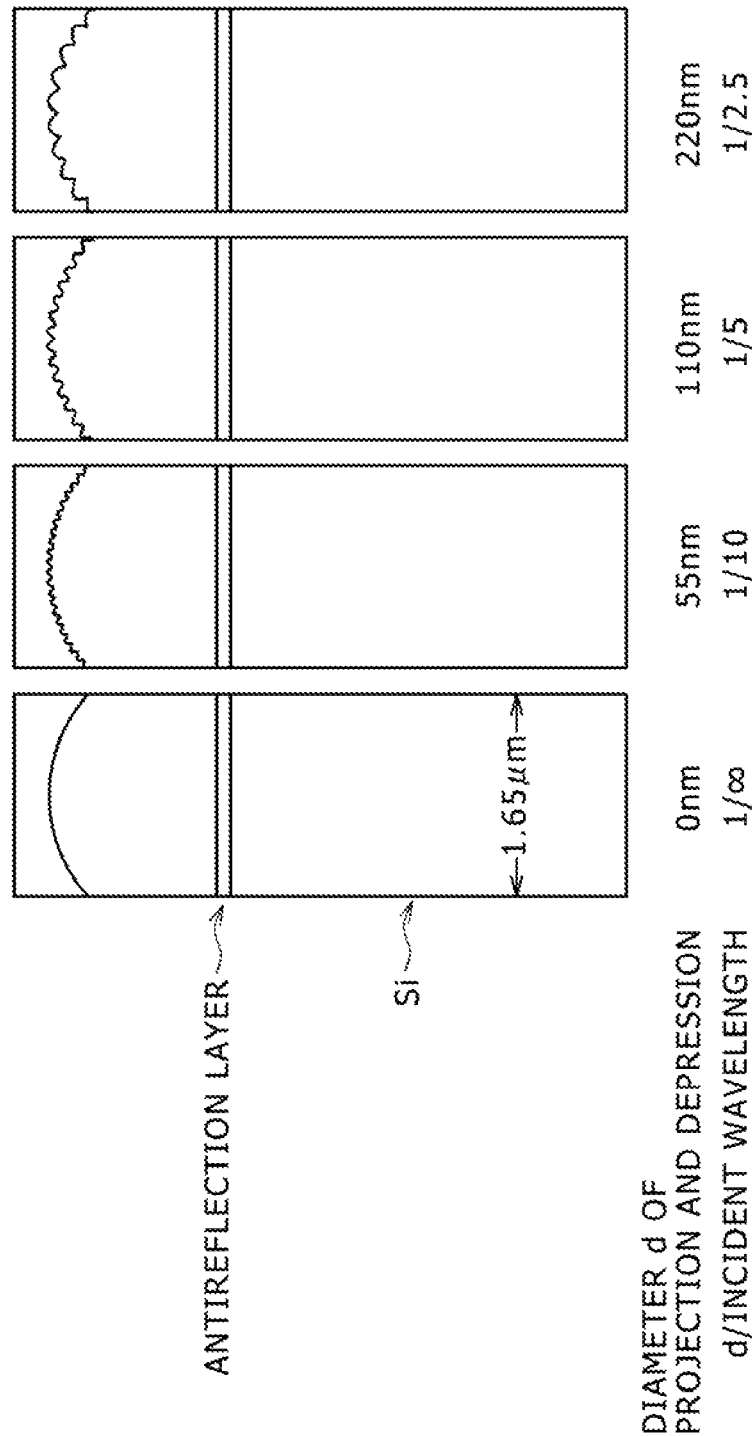
FIG. 6 is a diagram showing a pixel structure used in a simulation.
Figure 7:
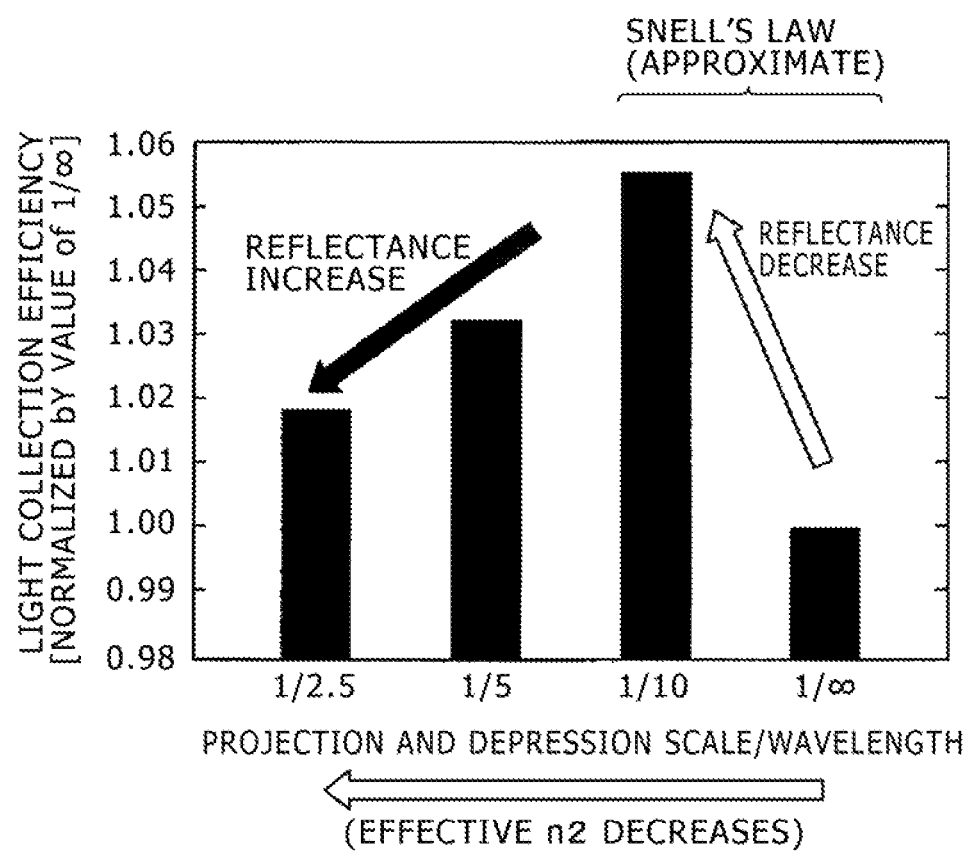
FIG. 7 shows a simulation result showing change in the light collection efficiency with respect to the projection and depression scale.

For example, based on assumption of a pixel structure shown in FIG. 6, the light collection efficiency when flat light having a wavelength of 550 nm was incident on a spherical lens having the projection and depression structure 11A was measured by an electromagnetic field simulation by use of a finite-difference time-domain (FDTD) method. In this simulation, the projection and depression scale (diameter d of the projection part) was set to 0 nm, 55 nm, 110 nm, and 220 nm. The structure with the projection and depression scale of 0 nm (diameter d/incident wavelength 550=1/∞) is equivalent to a normal lens having a smooth surface (lens having no projection and depression structure). FIG. 7 shows the simulation result.

As shown in FIG. 7, it turns out that the light collection efficiency tends to be enhanced as the projection and depression scale becomes larger if the projection and depression scale is sufficiently smaller than the incident wavelength, specifically e.g. if the projection and depression scale is equal to or smaller than ⅕, preferably ⅒, of the incident wavelength. In contrast, if the projection and depression scale is larger than ⅕ of the incident wavelength, deviation from the Snell's law occurs because of the influence of local scattering and so forth in the projection and depression structure. Thus, the reflectance increases and the light collection efficiency is lowered adversely. Therefore, it is desirable that the projection and depression scale is a minute projection and depression scale equal to or smaller than about ⅕ of the received-light wavelength as described above.

(Regulation of Projection and Depression Scale Distribution)

Figure 8:
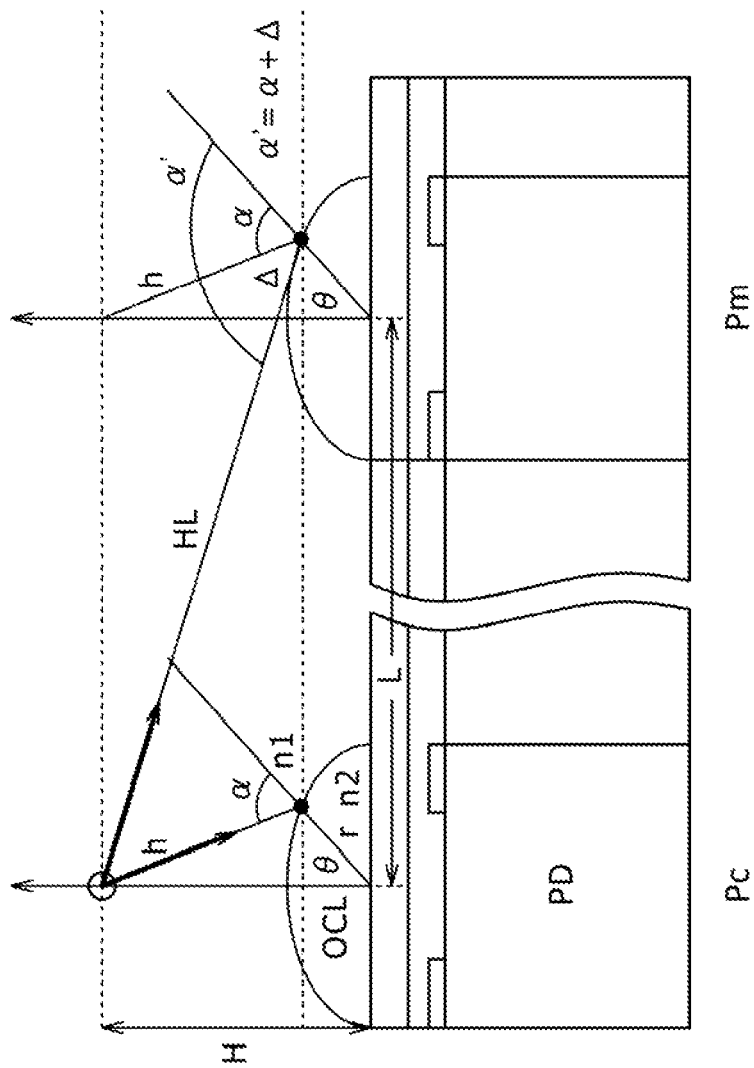
FIG. 8 is a conceptual diagram for explaining the principle of pupil correction and projection and depression design.

The relationship between the above-described projection and depression scale and the pixel position will be described below with reference to FIG. 8. Here, a consideration will be made about the light beam geometry regarding the center pixel Pc and a peripheral pixel Pm disposed at a position separate from the center pixel Pc by a distance L. The exit pupil distance is defined as H. The size of the on-chip lens 11 (diameter in the long axis direction) is defined as r. The angle of an arbitrary point on the lens surface is defined as θ. The incident angle of the light beam in the center pixel Pc is defined as α. The incident angle in the peripheral pixel Pm is defined as α' (=Δ+α). At this time, the relationships among the parameters can be represented by equations (3) to (5) shown above. Furthermore, generally the exit pupil distance H satisfies a relationship of H>>r in the image sensor. Thus, Δ can be approximately obtained from these equations (3) to (5) (equation (6)).

In addition, when the Snell's law is considered about the center pixel Pc and the peripheral pixel Pm, the relationships about the center pixel Pc and the peripheral pixel Pm can be represented by the following equations (7) and (8), respectively.

$$\text{Center Pixel:} \frac{\sin \alpha}{\sin \beta} = \frac{n2}{n1} \quad (7)$$

$$\text{Peripheral Pixel:} \frac{\sin(\alpha + \Delta)}{\sin \beta} = \frac{n2(L)}{n1} \quad (8)$$

Figure 9:
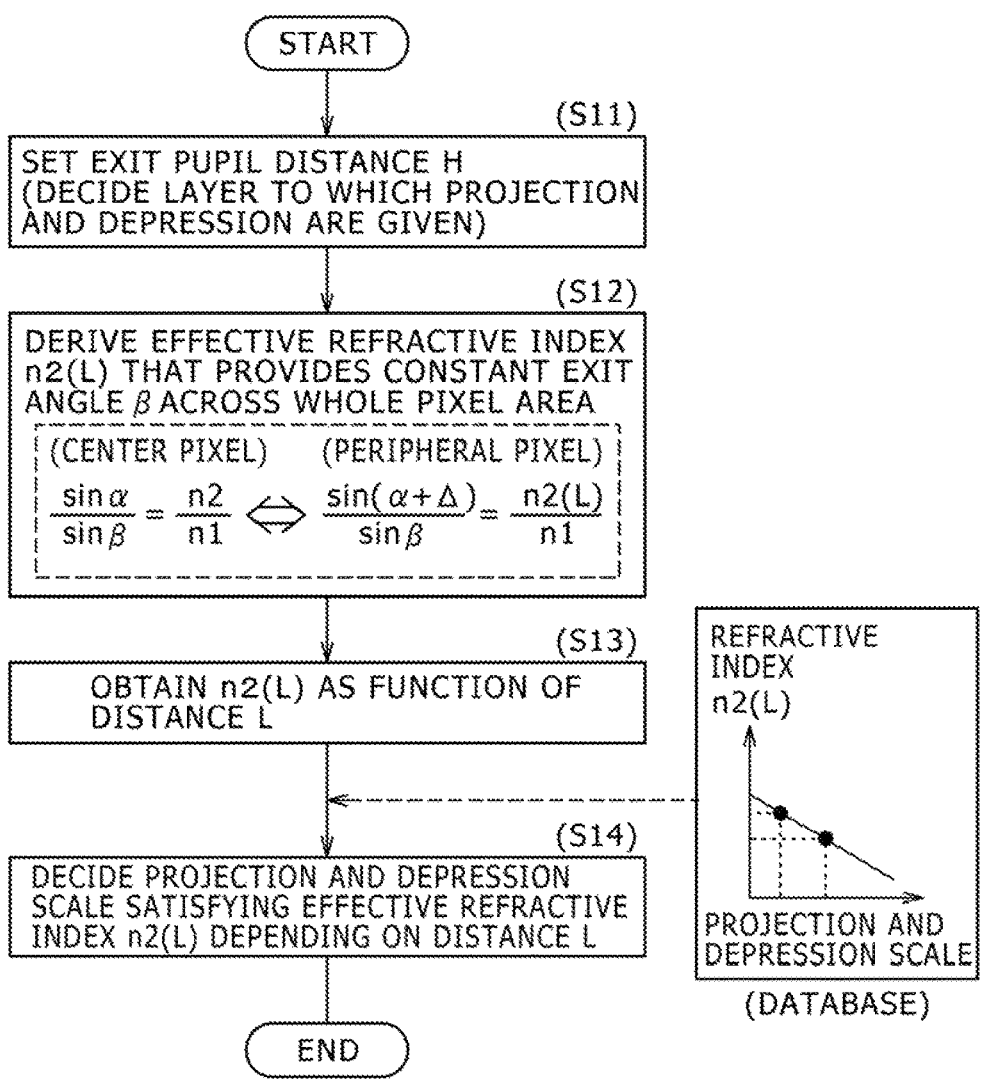
FIG. 9 is a flow diagram showing the procedure of the projection and depression design.

Here, a consideration is made about a scheme for keeping the exit angle β constant. From the above-described equations (7) and (8) and the above-described equation (6), for the peripheral pixel Pm, the effective refractive index n2(L) (>n2) that equalizes the exit angle β to that of the center pixel Pc can be obtained as a function of the distance L from the center pixel. If the relationship between such an effective refractive index n2(L) and the projection and depression scale is obtained in advance by experiment or simulation, the proper effective refractive index n2(L) is obtained according to the distance L from the center pixel Pc and the projection and depression scale corresponding to this effective refractive index n2(L) is decided. In this manner, the projection and depression scale satisfying the effective refractive index n2(L) that provides the constant exit angle β can be decided according to the pixel position (distance L). FIG. 9 is a flow diagram of such projection and depression design.

As shown in FIG. 9, in the design of the projection and depression scale of the projection and depression structure 11A, first the exit pupil distance (H) is set (step S11). That is, which optical functional layer in the light collecting part 10 is given the projection and depression structure is decided. In the present embodiment, the projection and depression structure is formed in the surface of the on-chip lens 11. Subsequently, from the light beam geometry about the center pixel Pc and the peripheral pixel Pm including the set exit pupil distance H, the effective refractive index n2(L) that equalizes the exit angle β between the peripheral pixel Pm and the center pixel Pc is derived (step S12). Thus, the effective refractive index n2(L) is obtained as a function of the distance L (step S13), and the projection and depression scale (satisfying the effective refractive index n2(L)) is decided based on the obtained effective refractive index n2(L) (step S14). The relationship between the effective refractive index and the projection and depression scale (acquired in advance by using e.g. simulation as described above) can be stored in e.g. a database (not shown) in advance.

[Method for Manufacturing Projection and Depression Structure]

The projection and depression structure 11A in the on-chip lens 11 can be manufactured in the following manner for example, based on the above-described projection and depression design. Specifically, it can be manufactured by a nanoimprint lithography method and a method by use of organic nanoballs (nanoball solution). These specific methods will be described below.

(Nanoimprint Lithography Method)

FIGS. 10A to 10E show manufacturing steps of the on-chip lens 11 by use of the nanoimprint lithography method in the step order. First, as shown in FIG. 10A, a lens mask base material 111a is formed on a lens base 110 and this lens mask base material 111a is subjected to reflow. Thus, as shown in FIG. 10B, a lens mask 111 is formed on the lens base 110. Here, only the area corresponding to one on-chip lens 11 (area of one pixel) is shown for simplification.

On the other hand, on a substrate, a mask material 112 composed of e.g. a photoresist is formed by light or electron beam exposure and so forth with a predetermined pattern (mask pattern that is based on the above-described projection and depression design and has the scale changing depending on the pixel position) (not shown). Subsequently, a droplet of polydimethylsiloxane (PDMS) is deposited on the thus pattern-formed mask material 112 and baking is performed at about 100° C. for 20 minutes. Thus, a PDMS mold 113 is formed (not shown). Thereafter, the temperature is returned to room temperature and the mask material 112 and the PDMS mold 113 are separated from the substrate. As shown in FIG. 10C, the mask material 112 and PDMS mold 113 fabricated in this manner are pressed against the surface of the above-described lens mask 111 to thereby transfer the mask material 112 to the surface of the lens mask 111. Because the PDMS mold is composed of an organic material, the pattern-formed mask material 112 can be transferred to even a curved surface such as a lens surface with high accuracy.

Thereafter, as shown in FIG. 10D, the lens base 110 provided under the formed lens mask 111 and mask material 112 is subjected to dry etching (etch back) by using the lens mask 111 and the mask material 112 as the etching mask. Thus, as shown in FIG. 10E, the on-chip lens 11 is formed and the projection and depression structure 11A having the projection and depression scale in accordance with the pattern of the mask material 112 can be formed in the surface of the on-chip lens 11. That is, the on-chip lens 11 having the projection and depression structure 11A in its surface is formed. One example of the etching conditions in this dry etching is as follows: a capacitive coupled plasma (CCP) etching apparatus is used; the flow rate of a fluorocarbon gas is 50 sccm (standard cubic centimeter per minutes); the flow rate of an oxygen gas is 20 sccm; the source power is 800 W; the bias power is 100 W; the gas pressure is 50 mT; and the lower electrode temperature is 20° C. However, these conditions are merely one example and the shape of the projection and depression structure of the surface can be finely controlled through adjustment of the kind of etching gas, the flow rate ratio of the etching gas, the gas pressure, the substrate temperature, the etching time, etc. If a resist residue is left at the end timing of the dry etching, this residue may be removed by thinner separation.

(Method by Use of Nanoball Solution)

Figure 11A:
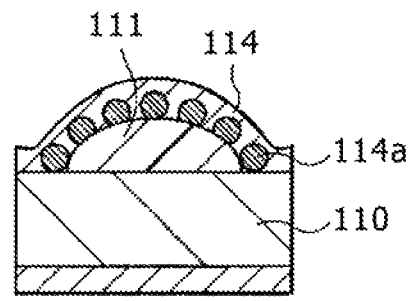
FIGS. 11A and 11B are schematic sectional views for explaining another processing process (method by use of a nanoball solution) for the projection and depression structure.
Figure 11B:
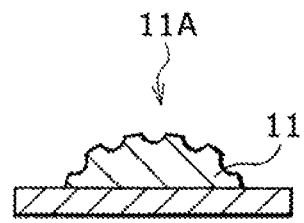

FIGS. 11A and 11B schematically show part of manufacturing steps of the on-chip lens 11 by use of a nanoball solution. First, the lens mask 111 is formed on the lens base 110 similarly to the above-described case of the nanoimprint lithography method. Thereafter, as shown in FIG. 11A, a nanoball solution 114 containing nanoballs (nanoparticles) 114a having predetermined scale (nanoballs that are based on the above-described projection and depression design and have the scale changing depending on the pixel position) is applied on the surface of the lens mask 111. The particle diameter of the nanoball 114a used is set in a range equal to or smaller than about 100 nm for example. As the material thereof, an organic material whose heat resistance and plasma resistance are higher than those of the photoresist, specifically e.g. a polyimide resin, is used.

However, these particle diameter and material are one example and proper particle diameter and material are selected depending on the shape of the projection and depression structure or the width and depth of the depression part (projection part). As the solvent, an organic solvent that has heat resistance and plasma resistance lower than those of the nanoballs and has a low viscosity is used. Examples of such an organic solvent include propylene glycol monomethyl ether (PGME), propylene glycol monomethyl ether acetate (PGMEA), ethyl lactate (EL), and pure water. The reason for using a solvent having a low viscosity is to apply the nanoball solution on the lens surface to such a small thickness as to be equivalent to the thickness of one nanoball and transfer the shapes of the individual nanoballs to the lens as uniformly as possible.

In applying the nanoball solution 114, using e.g. a PSL applying apparatus (particle spreading apparatus) makes it possible to spread the nanoball solution 114 on the lens surface with high accuracy (μm level or more minute level). However, another apparatus may be used as long as it can apply the nanoball solution 114 to an arbitrary wafer position with μm-level accuracy. An apparatus capable of wet coating such as spin coating may be used.

Subsequently, as shown in FIG. 11B, the lens base 110 to which the nanoball solution 114 is applied is subjected to dry etching (etch back) by using a mixed gas obtained by adding oxygen to a fluorocarbon gas or a mixed gas obtained by mixing oxygen to a chlorine gas. As the etching conditions in this dry etching, the same conditions as those in the above-described case of the nanoim print lithography method can be employed or other conditions may be employed. By this step, the on-chip lens 11 is formed and the projection and depression structure 11A having the projection and depression scale in accordance with the scale of the nanoballs 114a can be formed in the surface of the on-chip lens 11.

If a nanoball residue is left at the end timing of the dry etching, thinner separation may be performed similarly to the above-described case of the nanoim print lithography method. However, in the present method by use of the nanoballs 114a, such a residue is left less readily because the particle diameter of the nanoballs 114a is greatly different from the lens film thickness.

(Operation and Effects)

In the image sensor 1 of the present embodiment, the plural pixels are two-dimensionally arranged and each pixel has the light receiving part 20 including the photodiode 202 and the light collecting part 10 that collects incident light toward the light receiving part 20. The light collecting part 10 includes the on-chip lens 11 and the specific projection and depression structure 11A depending on the pixel position is provided in the surface of this on-chip lens 11. Specifically, the projection and depression scale of the projection and depression structure 11A is so designed as to satisfy the refractive index (effective refractive index) that keeps the exit angle ($\beta$) of the transmitted light beam of the on-chip lens 11 constant across the whole pixel area. Due to the giving of such a projection and depression structure 11A, the reflectance at the surface of the on-chip lens 11 is reduced and the effect of the pupil correction can be obtained. Therefore, the image sensor 1 can address sensitivity enhancement in association with the recent widening of the field of application of the imaging device. Furthermore, the need to provide an antireflection film on the on-chip lens surface is also eliminated differently from the related art. Thus, the image sensor 1 can address also further pixel miniaturization.

Figure 12:
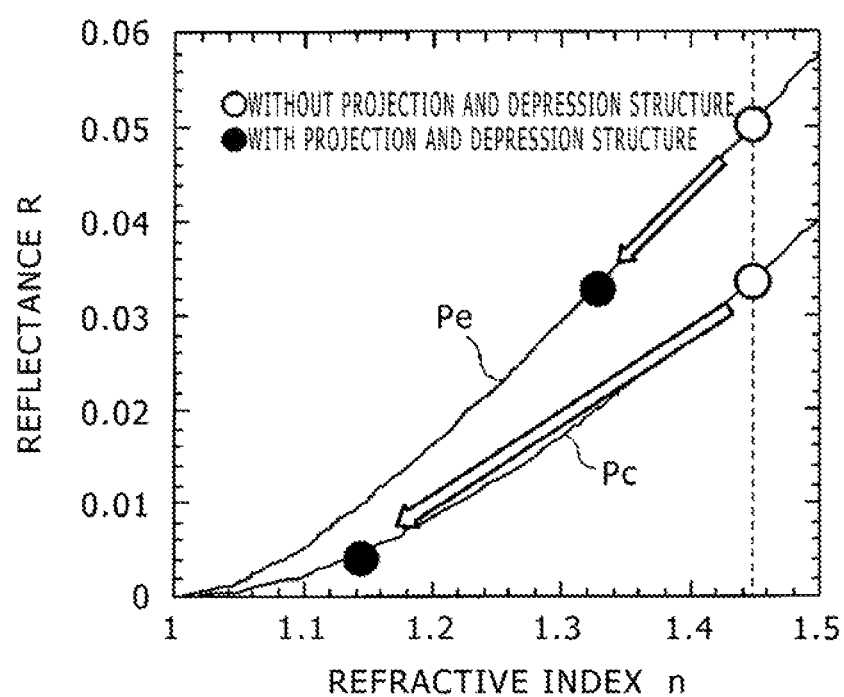
FIG. 12 is a characteristic diagram showing a reflectance improvement result.

For example, the pixel design was carried out under the following numerical conditions and the reflectance was measured. As a result, an improvement in the reflectance was confirmed. As the conditions, the projection and depression structure 11A having the projection and depression scale depending on the pixel position was provided in the surface of the on-chip lens 11. In addition, the exit pupil distance H was set to 1 mm. The unit pixel size was set to 1.4 µm×1.4 µm. The number of pixels was set to ten million. Furthermore, the lens diameter of the on-chip lens 11 was set to 1.4 µm. The film thickness of the color filter 12 (R, G, B) was set to 700 nm. The film thickness of the light blocking film 14 was set to 100 nm. The film thickness of the antireflection film 13 was set to 400 nm. Moreover, the film thickness of the photodiode (silicon) was set to 3 µm. In this configuration, the projection and depression scale was set to 100 nm in the center pixel and was so designed as to gradually become smaller in the direction toward the end pixel (effective refractive index changed between 1.4 and 1.1). FIG. 12 shows one example of the reflectance improvement of the center pixel Pc and end pixel Pe fabricated in this manner. As shown in FIG. 12, an effect of reflectance reduction by about several percentages is observed in both the center pixel Pc and the end pixel Pe. Furthermore, these values show an effect almost equivalent to that of the case in which an antireflection film is formed on the lens surface like the related art.

The projection and depression structure 11A, which provides the effects of such reflectance reduction and pupil correction, can be easily formed by e.g. a nanoimprint lithography method by use of a mask pattern corresponding to the predetermined projection and depression scale of the projection and depression structure 11A or a method by use of nanoballs corresponding to the projection and depression scale. That is, it is enough to merely adjust the scale of the component used as the mask, such as the mask pattern or the nanoballs. Thus, a mask having a complicated pattern shape does not need to be used and high processing accuracy is also not required. That is, it is possible to address pixel microminiaturization. Thus, in the image sensor 1, sensitivity enhancement and microminiaturization can be realized by a simple processing process.

Modification examples of the above-described embodiment (modification examples 1 to 4) will be described below. In the following, the same constituent element as that in the above-described embodiment is given the same numeral and description thereof is accordingly omitted.

Modification Example 1

Figure 13:
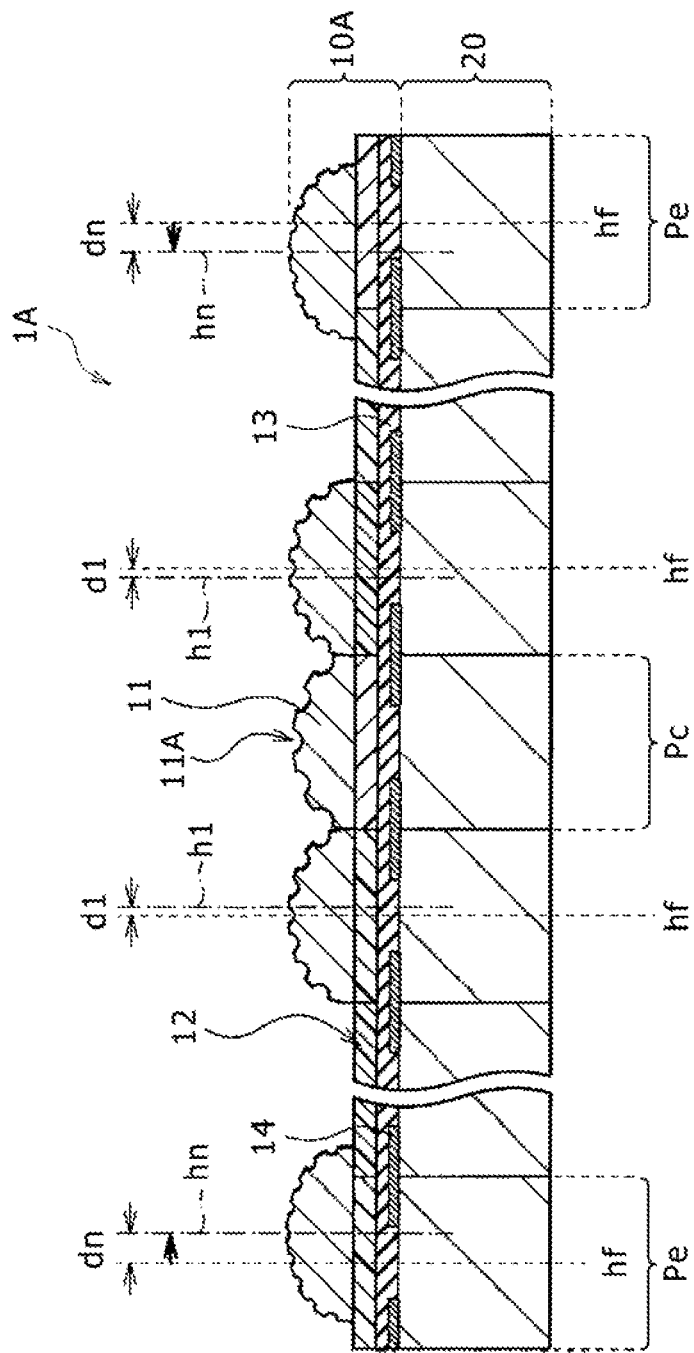
FIG. 13 is a schematic sectional view showing the schematic configuration of an image sensor according to modification example 1.

FIG. 13 shows the sectional configuration of an image sensor according to modification example 1 (image sensor 1A). The image sensor 1A is a back-illuminated solid-state imaging element and has a structure in which the plural pixels P are two-dimensionally arranged over a substrate, similarly to the image sensor 1 of the above-described embodiment. Each pixel P has the light receiving part 20 including a photoelectric conversion element (photodiode 202) and a light collecting part 10A including the on-chip lens 11. The light collecting part 10A has the color filter 12, the antireflection film 13, and the light blocking film 14 between the on-chip lens 11 and the light receiving part 20. In such a configuration, also in the present modification example, the projection and depression structure 11A exists in the surface of the on-chip lens 11 and this projection and depression structure 11A has predetermined projection and depression scale that differs in association with the pixel position, similarly to the above-described embodiment.

However, the present modification example has a structure in which the position of the on-chip lens 11 is shifted depending on the pixel position in addition to the above-described change in the projection and depression scale. Specifically, the on-chip lenses 11 in the pixels other than the center pixel Pc are so shifted that the center axes thereof (h1 to hn) are brought closer to the side of the center pixel Pc (inner side). The shift amounts, specifically e.g. the distances between the center axis hf of the light receiving part 20 (photodiode 202) and the center axes h1 to hn of the on-chip lenses 11 (shift amounts d1 to dn), are in such a relationship that the shift amount gradually becomes larger in the direction from the center pixel Pc toward the end pixel Pe (d1<d2< . . . <dn). The shift amount dn is e.g. 0.2 µm. Also by such lens shift, the effect of pupil correction can be obtained.

In the above-described case, the on-chip lenses 11 are shifted in the whole pixel area in such a manner that the shift amount gradually becomes larger in the direction from the center pixel Pc toward the end pixel Pe. However, all lenses do not necessarily need to be shifted and only the lenses of the end pixels Pe may be shifted for example. Alternatively, the lenses may be shifted in selected pixels among the pixels disposed on the end part side.

As just described, in addition to the provision of the predetermined projection and depression structure 11A for the on-chip lens 11, the lens position may be shifted to carry out pupil correction. This achieves advantageous effects equivalent to or larger than those of the above-described embodiment (further enhancement in the pupil correction effect).

Modification Example 2

Figure 14:
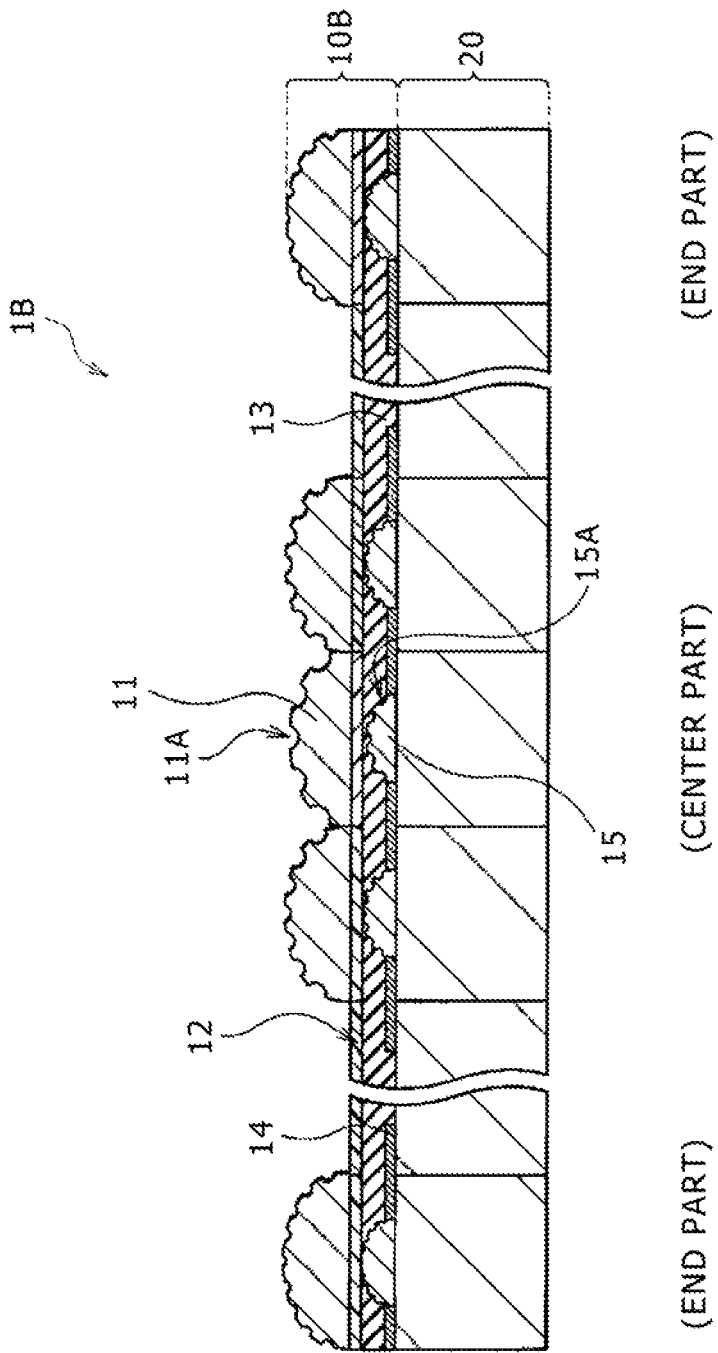
FIG. 14 is a schematic sectional view showing the schematic configuration of an image sensor according to modification example 2.

FIG. 14 shows the sectional configuration of an image sensor according to modification example 2 (image sensor 1B). The image sensor 1B is a back-illuminated solid-state imaging element and has a structure in which the plural pixels P are two-dimensionally arranged over a substrate, similarly to the image sensor 1 of the above-described embodiment. Each pixel P has the light receiving part 20 including a photoelectric conversion element (photodiode 202) and a light collecting part 10B including the on-chip lens 11. In such a configuration, also in the present modification example, the projection and depression structure 11A exists in the surface of the on-chip lens 11 and this projection and depression structure 11A has predetermined projection and depression scale that differs in association with the pixel position, similarly to the above-described embodiment.

However, in the present modification example, the light collecting part 10B has an inner lens 15 between the on-chip lens 11 and the light receiving part 20. Specifically, the inner lens 15 is disposed in the aperture area of the light blocking film 14 on the light receiving part 20 and the on-chip lens 11 is provided above this inner lens 15 with the intermediary of the color filter 12. By this multiple lens structure obtained by stacking the inner lens 15, the reflectance can be further reduced and the light collection efficiency can be enhanced.

In the present modification example, a projection and depression structure 15A similar to the projection and depression structure 11A in the on-chip lens 11 is provided also in the surface of the inner lens 15. That is, the projection and depression structure 15A of the inner lens 15 also has predetermined projection and depression scale depending on the pixel position. In this case, as the projection and depression scale of the projection and depression structure 15A, e.g. scale equivalent to the projection and depression scale obtained through the above-described design procedure (projection and depression scale equivalent to that of the on-chip lens 11 directly above the inner lens 15) is employed.

As just described, if the light collecting part 10B has the multiple lens structure, in addition to the provision of the predetermined projection and depression structure 11A for the on-chip lens 11, the similar projection and depression structure 15A may be provided also for the inner lens 15. This achieves advantageous effects equivalent to or larger than those of the above-described embodiment (further reduction in the reflectance and further enhancement in the pupil correction effect).

Modification Example 3

Figure 15:
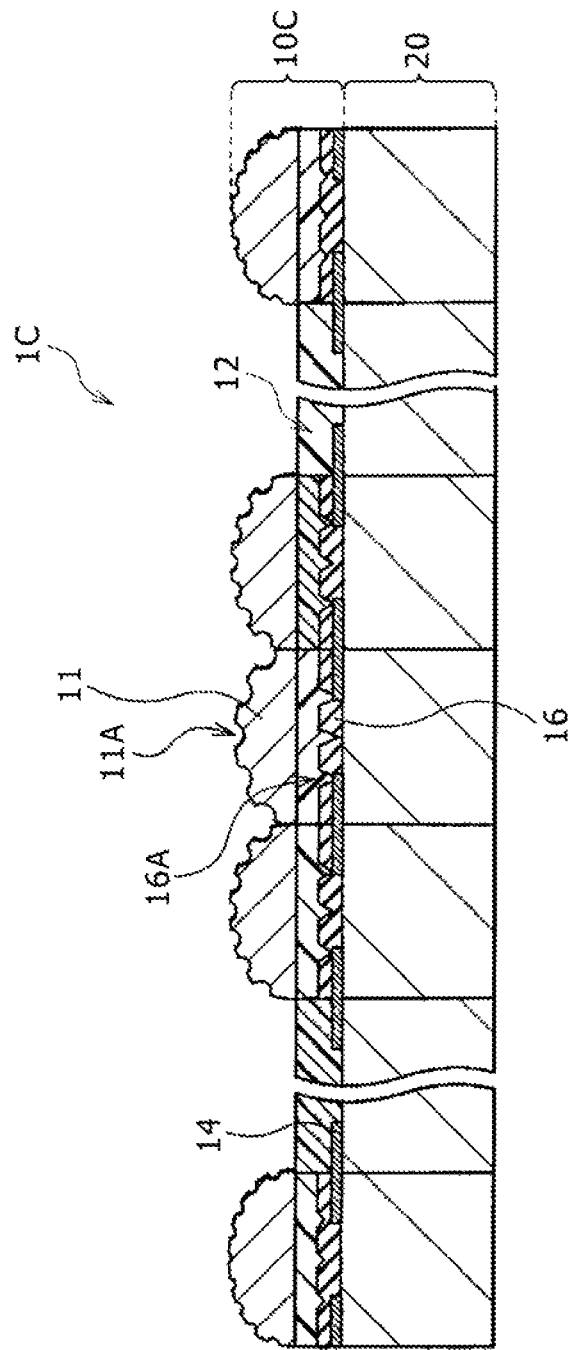
FIG. 15 is a schematic sectional view showing the schematic configuration of an image sensor according to modification example 3.

FIG. 15 shows the sectional configuration of an image sensor according to modification example 3 (image sensor 1C). The image sensor 1C is a back-illuminated solid-state imaging element and has a structure in which the plural pixels P are two-dimensionally arranged over a substrate, similarly to the image sensor 1 of the above-described embodiment. Each pixel P has the light receiving part 20 including a photoelectric conversion element (photodiode 202) and a light collecting part 10C including the on-chip lens 11. The light collecting part 10C has the color filter 12, an antireflection film 16, and the light blocking film 14 between the on-chip lens 11 and the light receiving part 20. In such a configuration, also in the present modification example, the projection and depression structure 11A exists in the surface of the on-chip lens 11 and this projection and depression structure 11A has predetermined projection and depression scale that differs in association with the pixel position, similarly to the above-described embodiment.

However, in the present modification example, in the light collecting part 10C, a projection and depression structure 16A similar to the projection and depression structure 11A in the on-chip lens 11 is provided also in the surface of the antireflection film 16. That is, the projection and depression structure 16A of the antireflection film 16 also has predetermined projection and depression scale depending on the pixel position. In this case, as the projection and depression scale of the projection and depression structure 16A, e.g. scale equivalent to the projection and depression scale obtained through the above-described design procedure (projection and depression scale equivalent to that of the on-chip lens 11 directly above the antireflection film 16) is employed.

As just described, in the light collecting part 10C, in addition to the provision of the predetermined projection and depression structure 11A for the on-chip lens 11, the similar projection and depression structure 16A may be provided also for the antireflection film 16. This achieves advantageous effects equivalent to or larger than those of the above-described embodiment (further reduction in the reflectance and further enhancement in the pupil correction effect).

Modification Example 4

Figure 16:
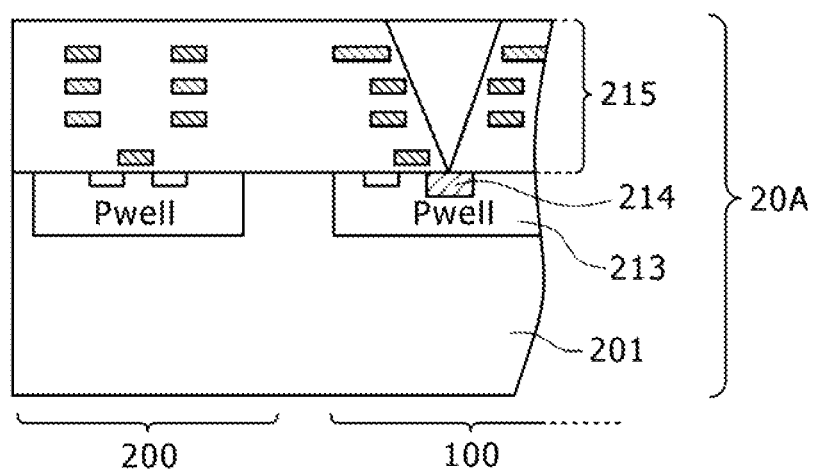
FIG. 16 is a schematic sectional view showing the schematic configuration of a light receiving part (front-illuminated type) according to modification example 4.

FIG. 16 shows the sectional configuration of a light receiving part in an image sensor according to modification example 4 (light receiving part 20A). In the above-described embodiment and so forth, a back-illuminated image sensor is taken as an example. However, an embodiment of the present disclosure can be applied also to a front-illuminated image sensor like that to be described below. Specifically, in the front-illuminated image sensor, the light receiving part 20A has a structure in which the pixel section 100 and the peripheral circuit section 200 are integrated over the same substrate 201. A silicon layer 213 in which a photodiode 214 is buried is provided on the substrate 201 and a wiring layer 215 including transistor and metal wiring is provided over this photodiode 214 (on the light incident side). The light collecting part 10 explained in the above-described embodiment and so forth is formed on this light receiving part 20A.

As just described, an embodiment of the present disclosure can be applied not only to the back-illuminated image sensor but also to the front-illuminated image sensor. Also in the case of the front-illuminated image sensor, advantageous effects equivalent to those of the above-described embodiment can be obtained.

APPLICATION EXAMPLES

Application examples of the image sensors explained in the above-described embodiment, modification examples, and so forth will be described below (application examples 1 to 4). All of the image sensors in the above-described embodiment and so forth can be applied to the electronic apparatus in various fields. As one example of the application, an imaging device (camera), an endoscope camera, a vision chip (artificial retina), and a biosensor will be described below. As a representative of the above-described image sensors, the image sensor 1 explained in the above-described embodiment will be taken as an example.

Application Example 1

Figure 17:
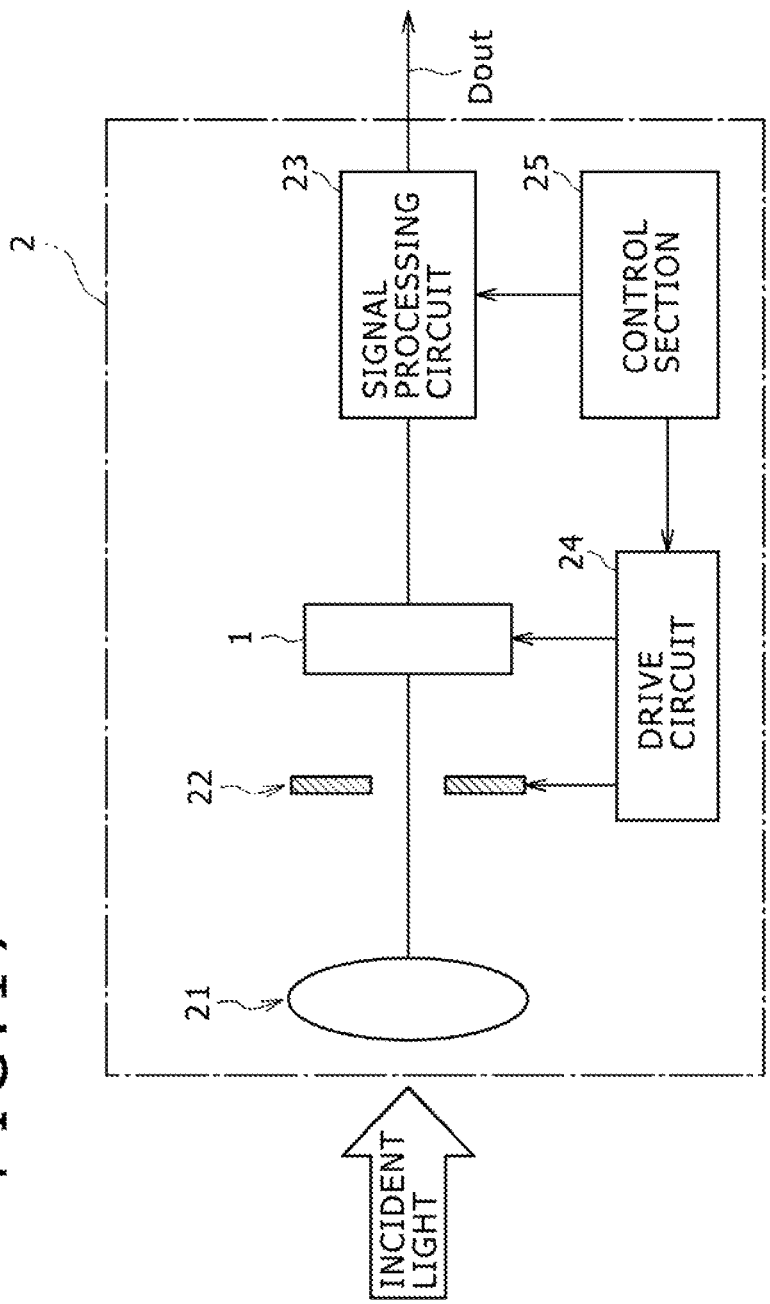
FIG. 17 is a functional block diagram showing the whole configuration according to application example 1 (imaging device)

FIG. 17 is a functional block diagram showing the whole configuration of an imaging device according to application example 1 (imaging device 2). The imaging device 2 is e.g. a digital still camera or a digital video camcorder and includes an optical system 21, a shutter device 22, the image sensor 1, a drive circuit 24, a signal processing circuit 23, and a control section 25.

The optical system 21 includes one or plural imaging lenses that form an image on the imaging plane of the image sensor 1 based on image light (incident light) from a subject. The shutter device 22 controls the period of light irradiation to the image sensor 1 (exposure period) and the light blocking period. The drive circuit 24 drives opening and closing of the shutter device 22 and drives exposure operation and signal reading operation in the image sensor 1. The signal processing circuit 23 executes predetermined signal processing, specifically e.g. various kinds of correction processing such as demosaic processing and white balance adjustment processing, for an output signal from the image sensor 1. The control section 25 is formed of e.g. a microcomputer. It controls the shutter drive operation and image sensor drive operation in the drive circuit 24 and controls the signal processing operation in the signal processing circuit 23.

In this imaging device 2, when incident light is received by the image sensor 1 via the optical system 21 and the shutter device 22, a signal charge based on the amount of received light is accumulated in the image sensor 1. The signal charge accumulated in the image sensor 1 is read out by the drive circuit 24 and the read electrical signal is output to the signal processing circuit 23. The output signal from the image sensor 1 is subjected to predetermined signal processing in the signal processing circuit 23 and output to the external (monitor and so forth) as a video signal Dout. Alternatively, it is retained in a storage section (storage medium) such as a memory (not shown).

Application Example 2

Figure 18:
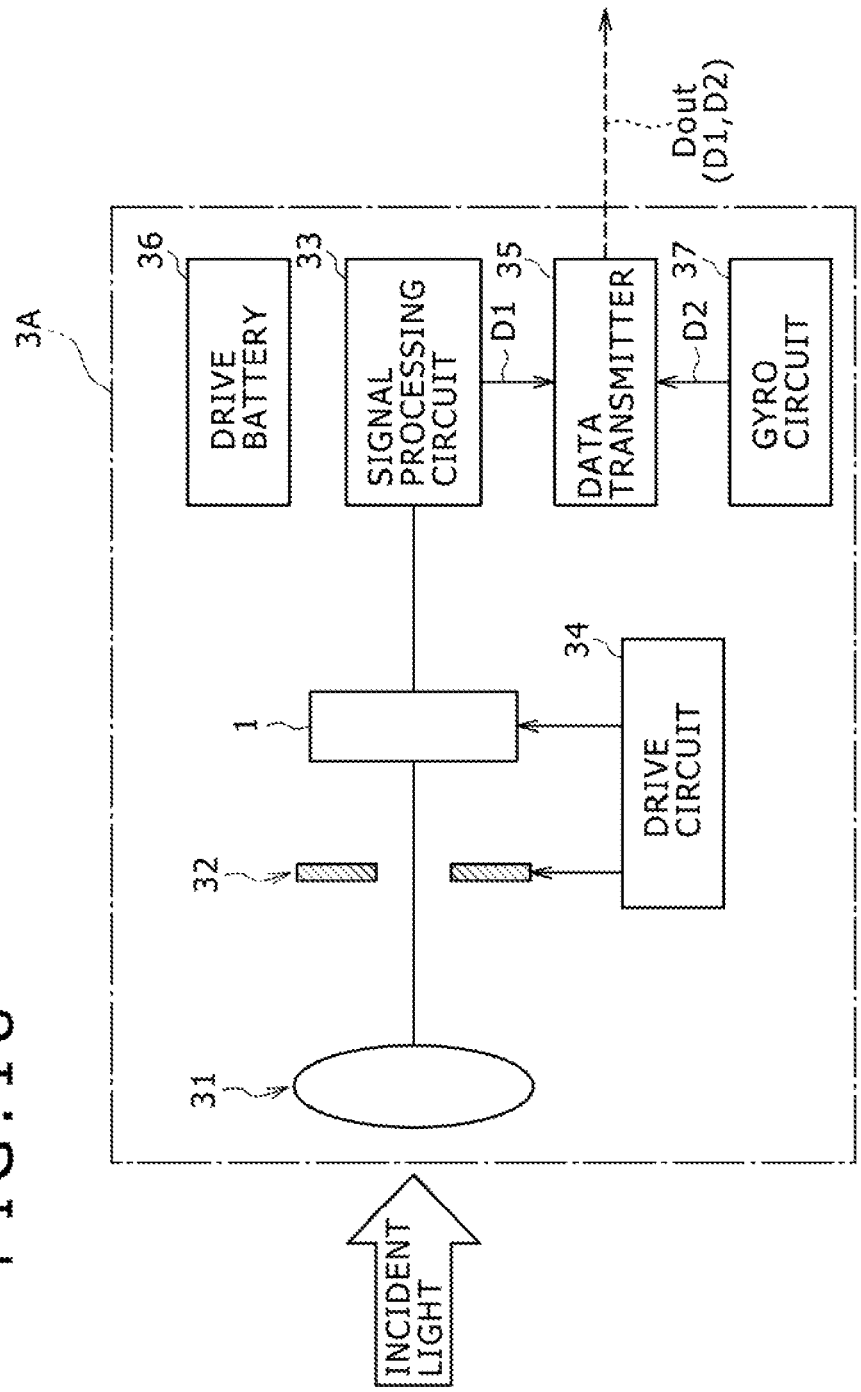
FIG. 18 is a functional block diagram showing the whole configuration according to application example 2 (capsule endoscope camera)

FIG. 18 is a functional block diagram showing the whole configuration of an endoscope camera according to application example 2 (capsule endoscope camera 3A). The capsule endoscope camera 3A includes an optical system 31, a shutter device 32, the image sensor 1, a drive circuit 34, a signal processing circuit 33, a data transmitter 35, a drive battery 36, and a gyro circuit 37 for sensing the posture (direction or angle). Among them, the optical system 31, the shutter device 32, the drive circuit 34, and the signal processing circuit 33 have functions similar to those of the optical system 21, the shutter device 22, the drive circuit 24, and the signal processing circuit 23 explained for the above-described imaging device 2. However, it is desirable that the optical system 31 is capable of photographing in plural orientations (e.g. all orientations) in a three-dimensional space, and the optical system 31 is composed of one or plural lenses. In the present example, a video signal D1 resulting from signal processing in the signal processing circuit 33 and a posture sensing signal D2 output from the gyro circuit 37 are transmitted to an external apparatus via the data transmitter 35 by wireless communication.

Figure 19:
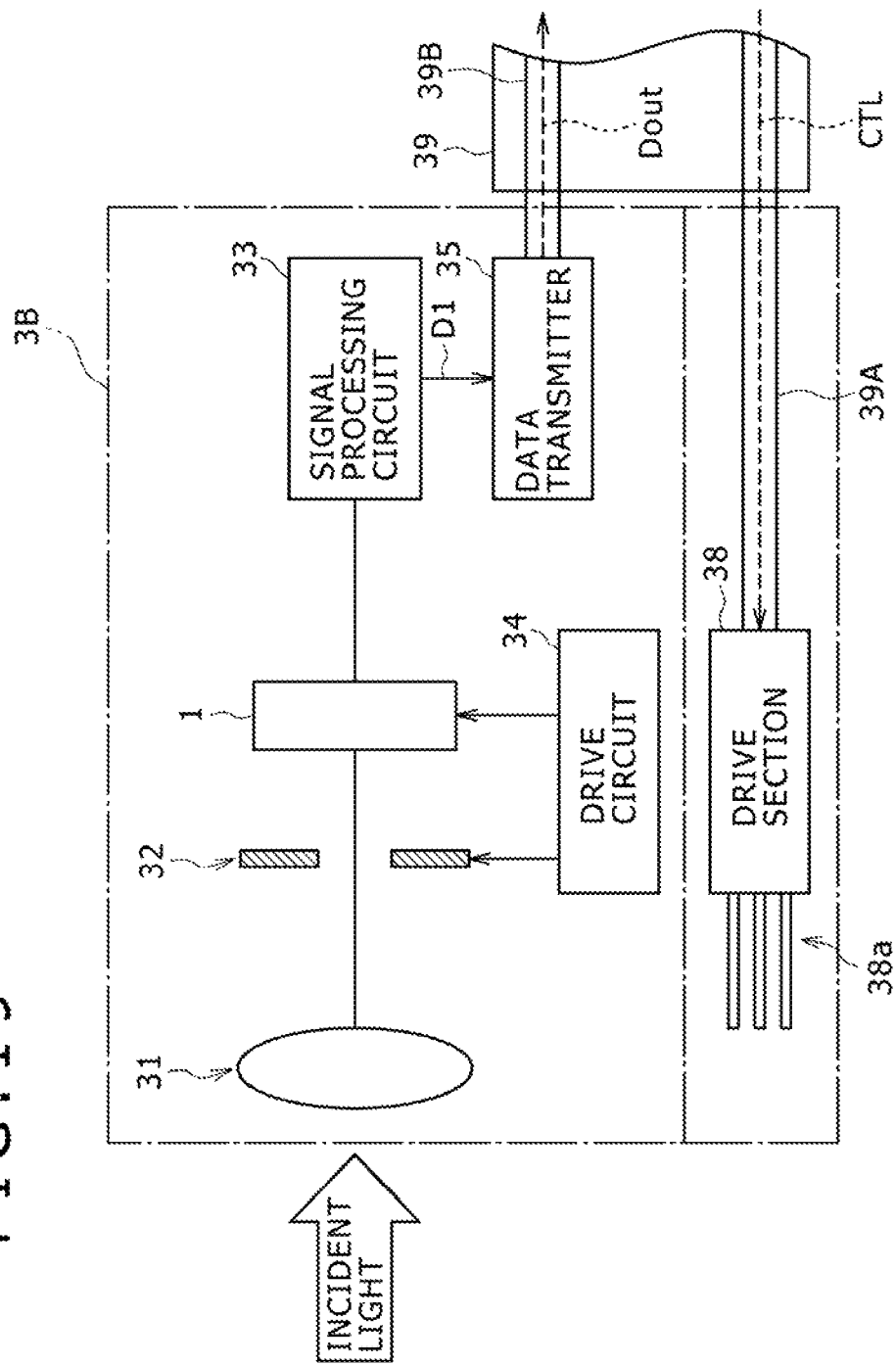
FIG. 19 is a functional block diagram showing the whole configuration according to another example of an endoscope camera (insertion endoscope camera)

The endoscope camera to which the image sensor of the above-described embodiment can be applied is not limited to the capsule endoscope camera like the above-described endoscope camera and may be e.g. an insertion endoscope camera like that shown in FIG. 19 (insertion endoscope camera 3B). The insertion endoscope camera 3B includes the optical system 31, the shutter device 32, the image sensor 1, the drive circuit 34, the signal processing circuit 33, and the data transmitter 35 similarly to a partial configuration in the above-described capsule endoscope camera 3A. This insertion endoscope camera 3B is further provided with an arm 38a that can be stored inside the device and a drive section 38 that drives this arm 38a. This insertion endoscope camera 3B is connected to a cable 39 having an interconnect 39A for transmitting an arm control signal CTL to the drive section 38 and an interconnect 39B for transmitting a video signal Dout based on a photographed image.

Application Example 3

Figure 20:
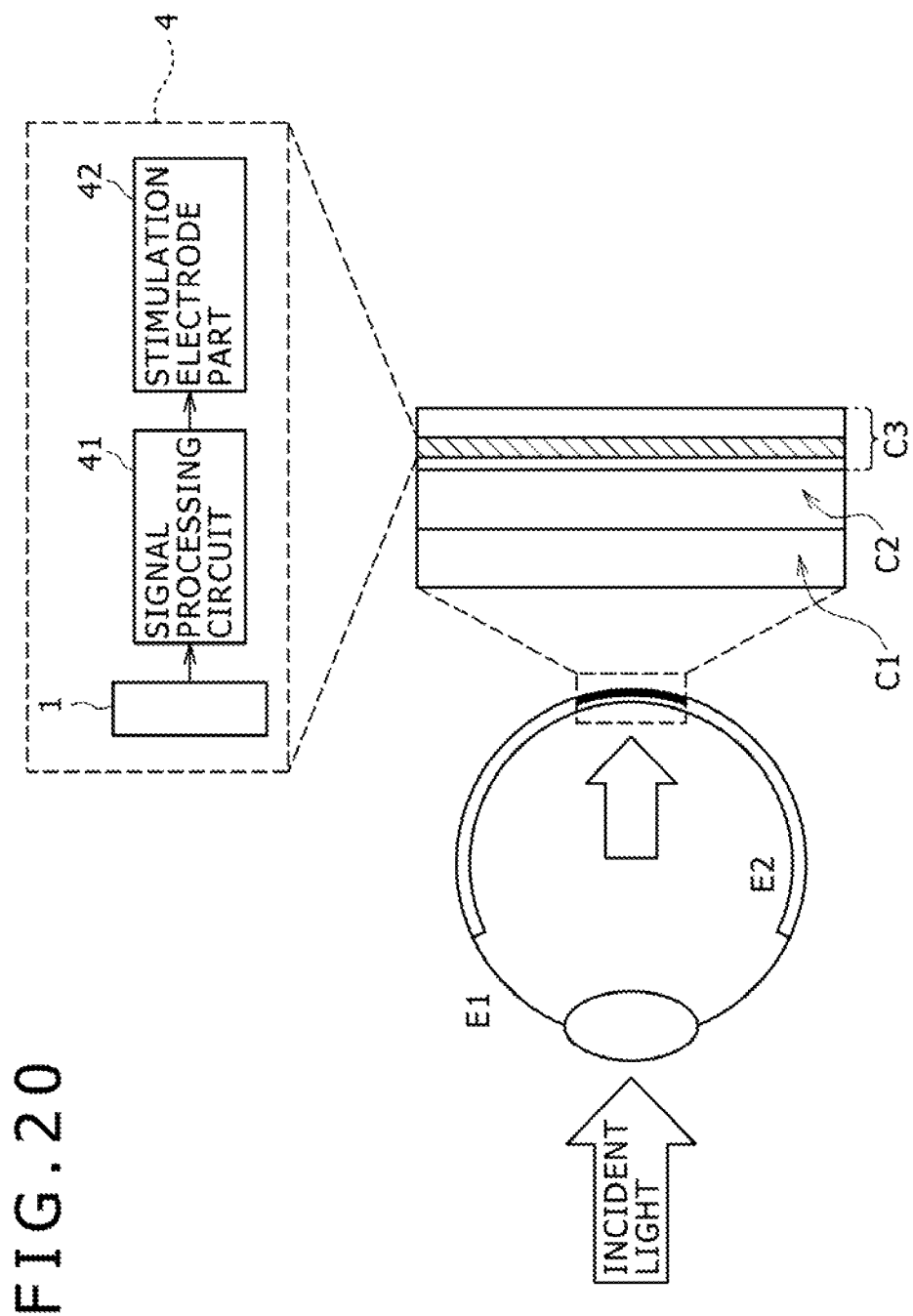
FIG. 20 is a functional block diagram showing the whole configuration according to application example 3 (vision chip)

FIG. 20 is a functional block diagram showing the whole configuration of a vision chip according to application example 3 (vision chip 4). The vision chip 4 is an artificial retina that is so used as to be buried in part of the back-side wall of an eyeball E1 of an eye (retina E2 having the optical nerve). This vision chip 4 is buried in e.g. part of any of a ganglion cell C1, a horizontal cell C2, and a photoreceptor cell C3 in the retina E2, and includes e.g. the image sensor 1, a signal processing circuit 41, and a stimulation electrode part 42. Based on this configuration, an electrical signal based on incident light to the eye is acquired in the image sensor 1 and the electrical signal is processed in the signal processing circuit 41 to thereby supply a predetermined control signal to the stimulation electrode part 42. The stimulation electrode part 42 has a function to give stimulation (electrical signal) to the optical nerve in response to the input control signal.

Application Example 4

Figure 21:
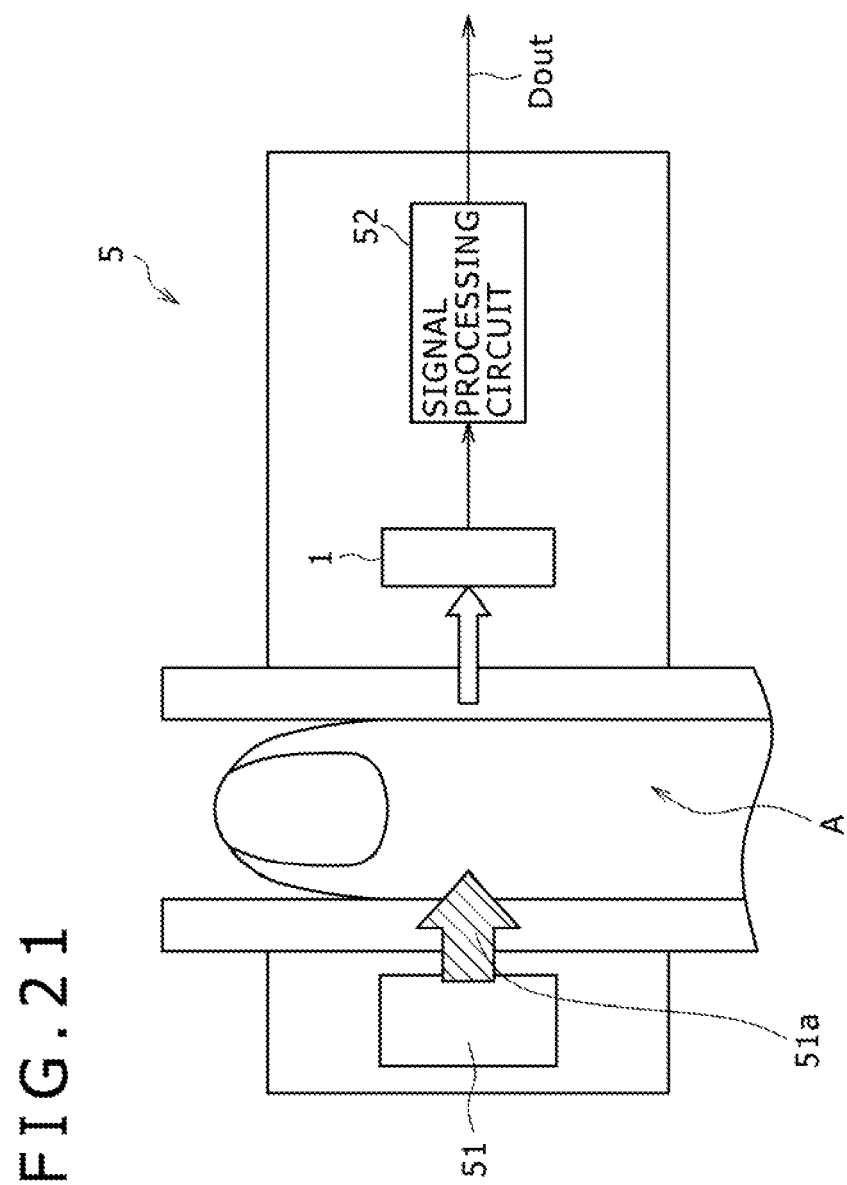
FIG. 21 is a functional block diagram showing the whole configuration according to application example 4 (biosensor).

FIG. 21 is a functional block diagram showing the whole configuration of a biosensor according to application example 4 (biosensor 5). The biosensor 5 is e.g. a blood sugar level sensor that can be mounted on a finger A, and includes a semiconductor laser 51, the image sensor 1, and a signal processing circuit 52. The semiconductor laser 51 is e.g. an infrared (IR) laser that emits infrared light (wavelength is 780 nm or longer). Based on this configuration, the degree of absorption of the laser light depending on the amount of glucose in the blood is sensed by the image sensor 1 to measure the blood sugar level.

Although embodiment and modification examples of the present disclosure are described above, the present disclosure is not limited to the above-described embodiment and various modifications are possible. For example, the above-described embodiment and so forth is explained by taking as an example the configuration in which the projection and depression structure 11A is provided in the surface of the on-chip lens 11. However, the on-chip lens 11 does not necessarily need to have the projection and depression structure 11A and it is enough that any optical functional layer in the light collecting part has a projection and depression structure. For example, it is possible that only the antireflection film provided between the light receiving part and the on-chip lens has a projection and depression structure. If the light collecting part has a multiple lens structure like that explained for the above-described modification example 2, it is possible that only the inner lens has a projection and depression structure. Conversely, further other optical functional layers may be provided between the on-chip lens and the light receiving part and a projection and depression structure similar to that of the on-chip lens may be provided also in the surfaces of these optical functional layers.

The present application contains subject matter related to that disclosed in Japanese Priority Patent Application JP 2011-035471 filed in the Japan Patent Office on Feb. 22, 2011, the entire content of which is hereby incorporated by reference.

It should be understood by those skilled in the art that various modifications, combinations, sub-combinations and alterations may occur depending on design requirements and other factor in so far as they are within the scope of the appended claims or the equivalents thereof.

What is claimed is:

1. An imaging element, comprising:
a plurality of pixels configured to be two-dimensionally arranged, the plurality of pixels comprising:
a first pixel, comprising:
a first photoelectric conversion element; and
a first light collecting part configured to collect incident light,
wherein the first light collecting part comprises a first projection and depression structure; and
a second pixel, comprising:
a second photoelectric conversion element; and
a second light collecting part configured to collect the incident light,
wherein the second light collecting part comprises a second projection and depression structure, and
wherein a first aspect ratio of the first projection and depression structure is equal to a second aspect ratio of the second projection and depression structure.

2. The imaging element according to claim 1, wherein the first pixel is closer to a center of the plurality of pixels than the second pixel.

3. The imaging element according to claim 1, wherein a first exit angle of a first light beam that passes through the first light collecting part is same as a second exit angle of a second light beam that passes through the second light collecting part.

4. The imaging element according to claim 1, wherein the first light collecting part comprises a first lens, and the second light collecting part comprises a second lens.

5. The imaging element according to claim 4, wherein a first surface of the first lens comprises the first projection and depression structure, and
a second surface of the second lens comprises the second projection and depression structure.

6. The imaging element according to claim 4, further comprising:
a first inner lens arranged between the first lens and the first photoelectric conversion element; and
a second inner lens arranged between the second lens and the second photoelectric conversion element.

7. The imaging element according to claim 6, wherein a first surface of the first inner lens comprises the first projection and depression structure, and
a second surface of the second inner lens comprises the second projection and depression structure.

8. The imaging element according to claim 4, further comprising
an antireflection film arranged between the first lens and the first photoelectric conversion element, and between the second lens and the second photoelectric conversion element.

9. The imaging element according to claim 8, wherein a third surface of the antireflection film comprises the first projection and depression structure and the second projection and depression structure.

10. The imaging element according to claim 4, wherein the first pixel is closer to a center of the plurality of pixels than the second pixel,
the first lens is shifted towards the center of the plurality of pixels by a first amount,
the second lens is shifted towards the center of the plurality of pixels by a second amount, and
the first amount is smaller than the second amount.

11. The imaging element according to claim 2, wherein a first scale of the first projection and depression structure is different from a second scale of the second projection and depression structure.

12. The imaging element according to claim 11,
wherein the first scale of the first projection and depression structure is larger than the second scale of the second projection and depression structure, and
wherein the first scale of the first projection and depression structure and the second scale of the second projection and depression structure for respective pixels of the plurality of pixels are based on a wavelength of the incident light.

13. A method of manufacturing an imaging element, comprising:
forming a plurality of pixels to be two-dimensionally arranged,
wherein forming the plurality of pixels comprises:
forming a first pixel and a second pixel,
wherein forming the first pixel comprises:
forming a first photoelectric conversion element; and
forming a first light collecting part,
wherein the first light collecting part comprises a first projection and depression structure and is configured to collect incident light; and
wherein forming the second pixel comprises:
forming a second photoelectric conversion element; and
forming a second light collecting part,
wherein the second light collecting part comprises a second projection and depression structure and is configured to collect the incident light, and
wherein a first aspect ratio of the first projection and depression structure is equal to a second aspect ratio of the second projection and depression structure.

14. The method according to claim 13,
wherein the first pixel is closer to a center of the plurality of pixels than the second pixel.

15. The method according to claim 13, wherein a first exit angle of a first light beam that passes through the first light collecting part is same as a second exit angle of a second light beam that passes through the second light collecting part.

16. The method according to claim 13, wherein the first light collecting part comprises a first lens, and the second light collecting part comprises a second lens.

17. The method according to claim 16, further comprising:
forming the first projection and depression structure in a first surface of the first lens; and
forming the second projection and depression structure in a second surface of the second lens.

18. The method according to claim 16, further comprising:
forming a first inner lens between the first lens and the first photoelectric conversion element; and
forming a second inner lens between the second lens and the second photoelectric conversion element.

19. The method according to claim 18, further comprising:
forming the first projection and depression structure in a first surface of the first inner lens; and
forming the second projection and depression structure in a second surface of the second inner lens.

20. The method according to claim 16, further comprising forming an antireflection film between the first lens and the first photoelectric conversion element, and between the second lens and the second photoelectric conversion element.

21. The method according to claim 20, further comprising forming the first projection and depression structure and the second projection and depression structure in a third surface of the antireflection film.

22. The method according to claim 16, wherein
the first pixel is closer to a center of the plurality of pixels than the second pixel,
the first lens is shifted towards the center of the plurality of pixels by a first amount,
the second lens is shifted towards the center of the plurality of pixels by a second amount, and
the first amount is smaller than the second amount.

23. The method according to claim 14, wherein
a first scale of the first projection and depression structure is different from a second scale of the second projection and depression structure.

24. The method according to claim 23,
wherein the first scale of the first projection and depression structure is larger than the second scale of the second projection and depression structure,
wherein the first scale of the first projection and depression structure and the second scale of the second projection and depression structure for respective pixels of the plurality of pixels are based on a wavelength of the incident light.

* * * * *